United States Patent [19]
Jacquin et al.

[11] Patent Number: 5,371,544
[45] Date of Patent: Dec. 6, 1994

[54] GEOMETRIC VECTOR QUANTIZATION

[75] Inventors: Arnaud E. Jacquin, New York, N.Y.; Nuggehally S. Jayant, Gillette; Christine I. Podilchuk, Bridgewater, both of N.J.

[73] Assignee: AT&T Corp., Murray Hill, N.J.

[21] Appl. No.: 832,536

[22] Filed: Feb. 7, 1992

[51] Int. Cl.$^5$ .............................................. H04N 7/12
[52] U.S. Cl. .................... 348/398; 348/422; 341/106; 375/122; 381/29
[58] Field of Search ............... 358/133, 135, 136, 138, 358/426, 433; 382/56; 341/106; 375/27, 122; 381/29, 30, 31; 348/398, 422; H04N 7/12, 7/13

[56] References Cited

U.S. PATENT DOCUMENTS

| | | | |
|---|---|---|---|
| 4,769,826 | 9/1988 | Kubo et al. | 375/122 |
| 4,780,761 | 10/1988 | Daly et al. | 358/133 |
| 4,797,739 | 1/1989 | Tanaka | 358/133 |
| 4,979,039 | 12/1990 | Kisor | 341/106 X |
| 5,010,401 | 4/1991 | Murakami et al. | 358/136 |
| 5,039,741 | 7/1991 | Barzach | 341/106 X |
| 5,063,444 | 11/1991 | Knauer et al. | 358/13 X |
| 5,079,631 | 1/1992 | Lhuillier et al. | 358/133 |
| 5,136,374 | 8/1992 | Jayant et al. | 358/136 X |
| 5,138,315 | 8/1992 | Le Queau et al. | 341/67 |
| 5,194,864 | 3/1993 | Nakano | 341/106 |

FOREIGN PATENT DOCUMENTS

| | | | |
|---|---|---|---|
| 89309378.1 | 3/1990 | European Pat. Off. | |
| WO90/15485 | 6/1990 | WIPO | H03M 7/30 |

OTHER PUBLICATIONS

N. S. Jayant and P. Noll "Digital Coding of Waveforms—Principles and Applications to Speech and Video", Prentice-Hall, Inc., Englewood Cliffs, N.J. (1984).

G. Karlson and M. Vetterli "Three Dimensional Sub--Band Coding of Video", Proceedings ICASSP, 1100–1103 (1988).

A. Gersho "On the Structure of Vector Quantizers", IEEE Transactions on Information Theory, vol. IT-28, No. 2, 157–166 (Mar. 1982).

C-H. Hsieh et al., "Fast Codebook Generation Algorithm for Vector Quantization of Images," Pattern Recognition Letters, vol. 12, No. 10, 605–609 (Oct. 12, 1991).

J. D. Johnson "A Filter Family Designed for Use in Quadrature Mirror Filter Banks", 291–294, IEEE (1980).

D. Chen and A. C. Bovik "Fast Image Coding Using Simple Image Patterns", SPIE vol. 1199, 1461–1471 (1989).

Y. Linde, A. Buzo and R. M. Gray "An Algorithm for Vector Quantizer Design", IEEE Transactions on Communications, vol. COM-18, No. 1, 84–95 (Jan. 1980).

R. J. Safranek and J. D. Johnston "A Perceptually Tuned Sub-band Image Coder with Image Dependent Quantization and Post-quantization Data Compression", IEEE, 1945–1948 (1989).

F. K. Soong and B-H. Juang "Optimal Quantization of LSP Parameters", IEEE, 394–397 (1988).

J. D. Gibson "Lattice Quantization", Advances in Electronics and Electron Physics, vol. 72, 259–330 (1988).

F. K. Soong and B-H. Juang "A Globally Optimal Quantizer Design", 1988 IEEE International Symposium on Information Theory, 38–39.

*Primary Examiner*—Victor R. Kostak
*Attorney, Agent, or Firm*—Thomas A. Restaino

[57] ABSTRACT

A geometric vector quantizer coding technique is illustrated in the context of a full motion video coder based on a three-dimensional sub-band framework. The original image data is decomposed into different spatial-temporal frequency bands and based on the data in each band, different quantization strategies are applied to the bands. The lowest spatial-temporal frequency band is coded using a traditional three-dimensional switched predictor and optimum scaler quantizer. The non-dominant sub-bands are coded using the vector quantization approach to efficiently encode the images while appropriately exploiting the sparse, highly structured nature of the data to design the codebooks. Variable resolution is achieved using these techniques and no training is needed to establish or maintain the codebook. A fast codebook search technique is provided for identifying the optimal codebook vector for representing a block of input data. Examples of two and three level geometric vector quantizers are also provided.

21 Claims, 5 Drawing Sheets

| 11 | 9 |
|----|---|
| 10 | 8 |

| 7 | 5 | |
|---|---|---|
| 6 | 4 | 2 |
|   | 3 | 1 |

| 1 | 2 | 3 |
|---|---|---|
| 4 | 5 | 6 |
| 7 | 8 | 9 |

(a)

| $X_1$ | $X_2$ | $X_3$ |
|---|---|---|
| $X_4$ | $X_5$ | $X_6$ |
| $X_7$ | $X_8$ | $X_9$ |

(b)

(c)

(a)

(b)

(c)

(d)

(e)

(f)

(g)

(h)

(i)

GEOMETRIC VECTOR QUANTIZATION

FIELD OF THE INVENTION

This invention relates to the efficient digital coding of multi-valued signals and, more particularly, to the digital coding of high quality audio, video and other signals at low bit rates. However, the present invention will be described in illustrative embodiments in the context of coding of images such as video signals.

BACKGROUND OF THE INVENTION

Good quality, low bit rate video coding is required for such applications as teleconferencing over existing and future networks, including ISDN. An effective low bit rate coder should remove the redundancy due to spatial and temporal correlations along with the perceptually irrelevant components of an image sequence. One very effective coder for still image compression (described in U.S. patent application Ser. No. 07/350,435 by J. D. Johnston and R. J. Safranek, entitled *Perceptually-Tuned Sub-band Image Coder*, filed May 4, 1989, and in R. J. Safranek and J. D. Johnston, *A Perceptually Tuned Sub-band Image Coder With Dependent Quantization and Post Quantization*, Proc. ICASSP, 1989) which incorporates statistical as well as perceptual criteria into the coding strategy. However, good quality full motion video coding at low bit rates (e.g., 384 kbps or less) has remained an elusive problem.

Sub-band digital coding techniques are well-known in the art. See, e.g.. N. S. Jayant and P. Noll, *Digital Coding of Waveforms: Principles and Applications to Speech and Video*, Prentice Hall, 1984.

Sub-band coding techniques have been used for image coding as described in G. Karlsson and M. Vetterli, *Three Dimensional Sub-band Coding of Video*, Proc. IEEE ICASSP, 1988, 1100–1103. The techniques described there employ multi-dimensional filtering to generate spatial-temporal sub-bands using so-called quadrature mirror filters. These latter filters are described, e.g., in J. D. Johnston, *A Filter Family Designed for Use in Quadrature Mirror Filter Bands*, Proc. IEEE ICASSP, 1980, and in the Jayant and Noll book, supra, chapter 11.

Another technique for encoding images is described in D. Chen and A. C. Bovik, *Fast Image Coding Using Simple Image Patterns*, SPIE, vol. 1199, Visual Communications and Image Processing IV (1989), pp. 1462–1471. The techniques described in the Chen and Bovik paper use a small number of local patterns as subimages, the selection of such patterns being based on measured properties of biological vision systems and a viewing geometry model. The selection of patterns (subimages) to represent an image is not based on typical error criteria such as the minimum mean square error metric.

A generally useful coding technique used to reduce required bit-rates is known as vector quantization. See, e.g., Jayant and Noll, supra, chapter 9, and A. Gersho, *On the Structure of Vector Quantization*, IEEE Trans. Info. Theory, vol. IT-28, pp. 157–165, March, 1982. Such techniques compare an input sequence to be coded to "vectors" stored in an ordered list or codebook. When the best match (in accordance with some predetermined criterion) is found in the codebook, the index for that vector is selected to represent the input sequence. Generally, some training operation is employed to generate the codebook and to update it over time.

SUMMARY OF THE INVENTION

The present invention extends and simplifies the general class of vector quantization techniques by providing low-bit-rate coding for a variety of signals, including audio, video, geophysical and other signals. An important advantage of the present technique is that it requires no training to generate and maintain a vector codebook for important applications.

The codebook is advantageously chosen as a set of geometric patterns, each pattern having two or more elements, as appropriate to the application. Thresholding techniques prove useful in allowing the use of a reference or "null" vector to be selected when the significance of a subset of input signals falls below a predetermined threshold. It proves convenient to use well-known Huffman coding techniques to represent the code vectors and associated magnitude information, with frequently occurring vectors being represented by short code sequences. Thus variable resolution coding is achieved and the number of bits needed to represent the input sequence is significantly reduced, especially when the input is "sparse" in significant portions. An example of such sparse inputs is image information in which a background is essentially constant over substantial parts of the image.

The present invention further provides a fast codebook search technique which identifies the optimal codebook vector (in a least-squares error sense) with significantly fewer computations than it takes to do so with an exhaustive codebook search.

The present invention will be described in greater detail in connection with a new system and method of low bit rate video encoding which employs a three-dimensional sub-band scheme. Illustratively, an image sequence is separated into different spatial-temporal frequency bands, using ten-tap one-dimensional quadrature mirror filters (qmfs) of the type described in J. D. Johnston, *A Filter Family Designed For Use in Quadrature Mirror Filter Banks*, Proceedings IEEE ICASSP, 1980. The sub-band which contains the lowest spatial-temporal frequency components is coded with high quality, typically using a standard ADPCM code, while the non-dominant sub-bands are quantized using a low bit rate vector quantization (VQ) method incorporating a new structured codebook in accordance with one aspect of the present invention.

Perceptually irrelevant sub-bands (which typically comprise the highest temporal and spatial frequency components) are advantageously not coded.

The other non-dominant sub-bands are the high frequency sub-bands which have relatively low energy content, but which contain perceptually significant data in the form of edge information and other high frequency details. This information appears in a very structured form within each sub-band and each sub-band advantageously has a structure associated with it relating to its spatial-temporal frequency location. These sub-bands are coded at a much lower bit rate than the dominant low frequency sub-band using the vector quantizing techniques of the present invention.

BRIEF DESCRIPTION OF THE DRAWINGS

FIG. 8a presents 16 pixels constituting an original 4×4 input block.

FIG. 8b presents the result of two applications of a fast search, two-magnitude technique on the input block presented in FIG. 8a.

DETAILED DESCRIPTION

As noted above, the field of sub-band coding is well developed. Reference is made to the book by Jayant and Noll, especially chapter 11, for much background information and prior art techniques. Likewise, the above cited patent application by Johnston and Safranek is useful in this regard and is, accordingly, incorporated by reference and considered to be a part of the present description.

FIGS. 1(a) and 1(b), based generally on FIG. 11.1 of the cited Jayant and Noll book, show the overall framework for an image coder and decoder, respectively, illustrating use of the present invention.

Also treated generally in the Jayant and Noll book are so-called quadrature mirror filter bank techniques. These techniques are adapted in some aspects for use in the present invention. Thus Jayant and Noll, in FIG. 11.6 show a system for quadrature "mirror" filtering used to split an input sequence of samples into two equal-width sub-bands. This and related filtering techniques are described in Section 11.4 of the Jayant and Noll book. Also see Y. Linde, A. Buzo, and R. M. Gray, *An Algorithm For Vector Quantizer Design*, IEEE Transactions on Communications, COM-28, pp. 84–95, January 1980.

Figure 1:
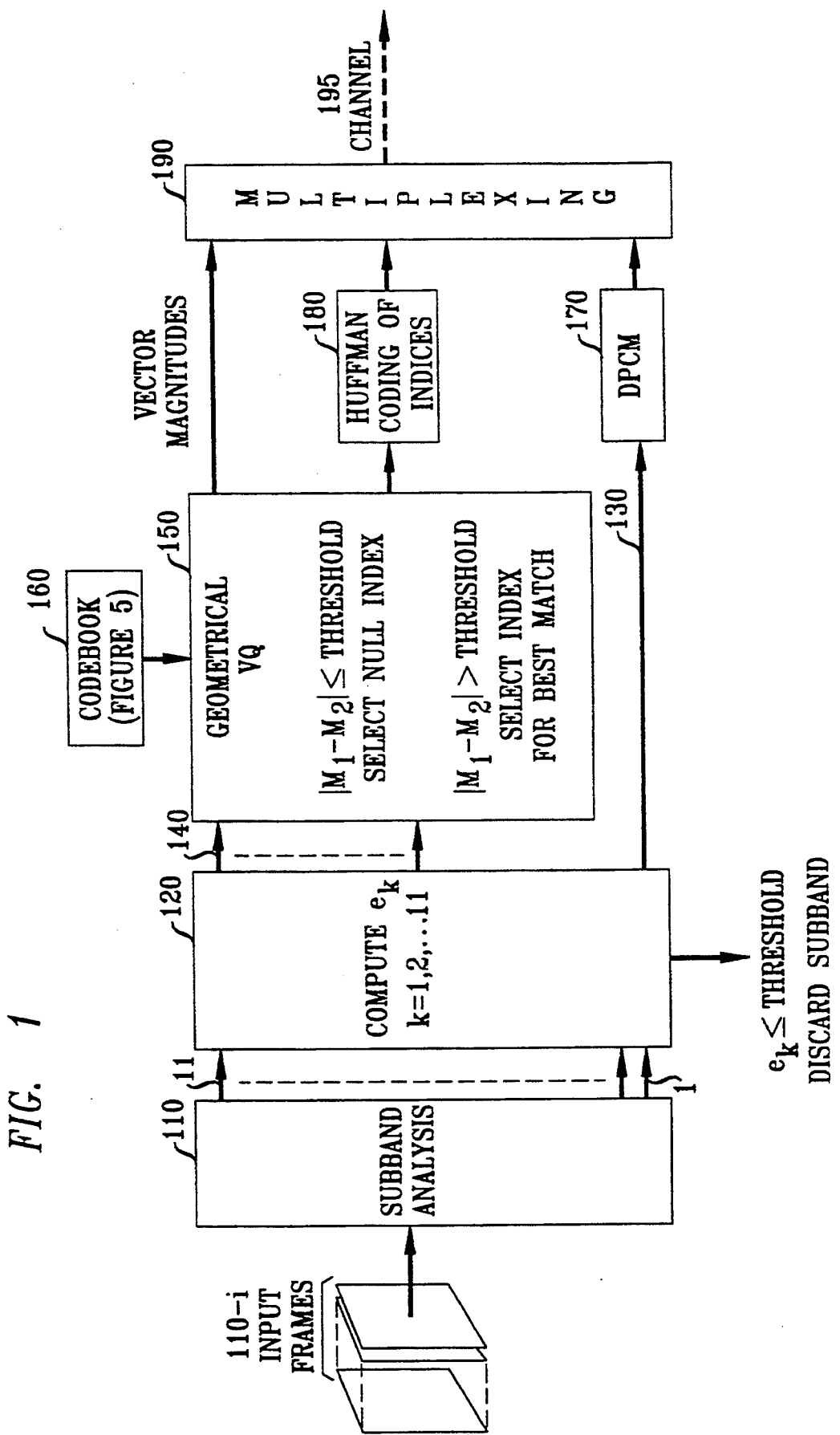
FIGS. 1 and 2 show an overall block diagram of a digital image coder and decoder, respectively, employing the present invention.
Figure 2:
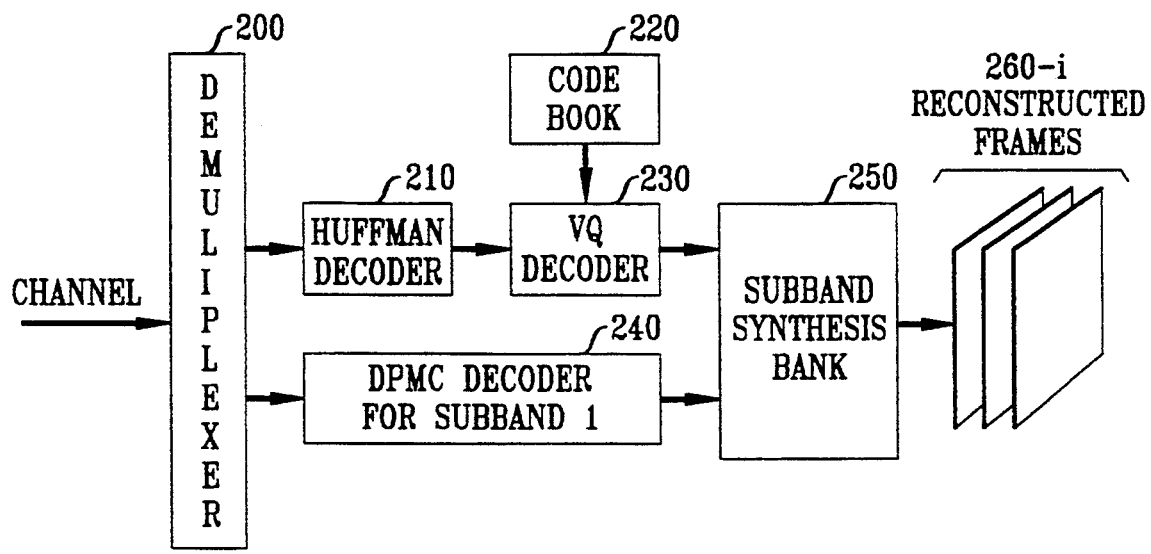

FIG. 1 shows an image encoder which advantageously employs the geometric vector quantizer of the present invention. Correspondingly, FIG. 2 shows an image decoder based on these same inventive techniques. Each of these system elements will now be described individually.

FIG. 1 shows a representation of a graphical image, e.g., sequential frames of a video image, 100-i. Since the sub-band filtering used in this illustrative image coding application advantageously uses 10 taps, it proves convenient to store ten successive frames of the input signal. As a specific example, each frame may contain 288×360 pixels. For present purposes, the image will be considered to be a multi-level image having up to 256 possible intensity levels. Color images are, of course, amenable to coding using the present inventive techniques, but discussion of these application will be deferred.

The successive frames of video information are applied to the sub-band analysis block 110 (described in greater detail in connection with FIG. 3) in FIG. 1 (typically at a rate of 30 frames per second) there, spatial-temporal components are generated and applied to an energy measuring block 120. As noted earlier, the image is separated into 11 spatial-temporal sub-bands; the energy in each of these bands is separately determined as will be shown in more detail in connection with the discussion of FIG. 3.

Figure 3:
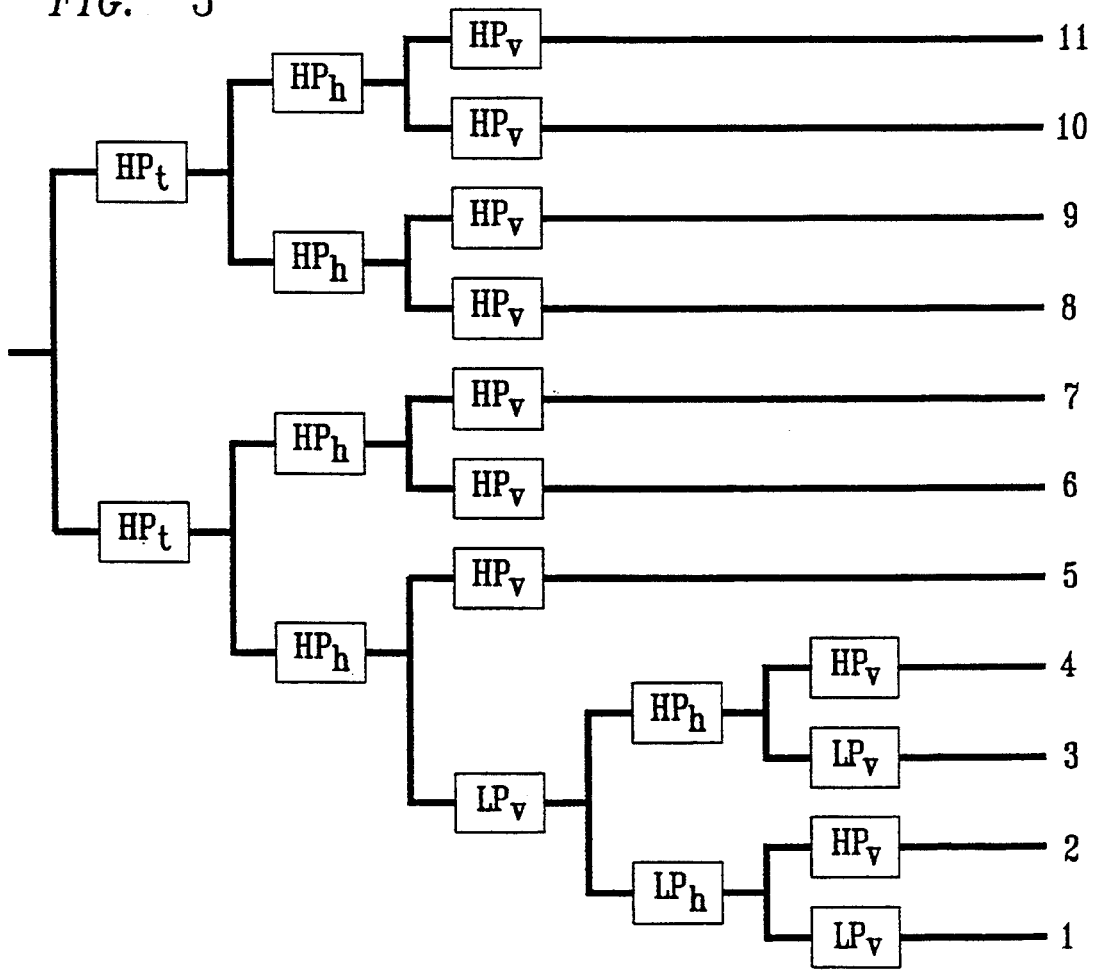
FIG. 3 shows a typical sub-band filter arrangement in accordance with one aspect of the present invention.

In a typical embodiment of the present invention, the sub-band framework illustratively used consists of 11 temporal-spatial frequency bands as shown in FIG. 3. Except for the particular choice of sub-band filters, this is the same basic structure as used in G. Karlsson and M. Vetterli, *Three Dimensional Sub-band Coding of Video*, Proc. ICASSP, 1988. The terms HP and LP refer to high-pass filtering and low-pass filtering respectively while the subscripts t, h, and v refer to temporal, horizontal and vertical filtering respectively. The sub-bands whose energy falls below an empirically derived threshold value are discarded without causing severe degradation in the reconstructed image sequence. The remaining sub-bands are coded using a predictive coder and optimum scalar quantizer, as will now be described in greater detail.

Because many applications, such as the presently considered image coding application, may include signal components having negligible components, it proves useful to apply an energy threshold test to the individual components as indicated in block 120 in FIG. 1. In the case of the system of FIG. 1, the energy output for each spatial-temporal sub-band is compared with a previously determined threshold. It proves convenient to calculate the energy in the currently considered example by $$e_k = \sum_{i,j} x_{k,i,j}^2 \text{ for } k = 1, 2, \ldots, 11,$$

where $X_{k,i,j}$ is the intensity at the ith row, jth column in sub-band k. If the energy in a sub-band is below the threshold, then no further coding of that sub-band is performed for the current time frame.

While the threshold levels can be different for each sub-band, it proves convenient to select a fixed threshold for use with all (or almost all) sub-bands in many cases. Thus, for example, when the range of values of intensity for the multi-level signals (pixels in the image coding system of FIG. 1) is (−128, 128), a useful threshold value is chosen as 20 for all components (sub-bands).

Because the lowest spatial-temporal sub-band includes much of the basic image structure of the image, the energy level for that sub-band is generally well in excess of the threshold. In fact, for the presently considered application, it proves advantageous to code this lowest spatial-temporal side-band using a high quality DPCM coder 170 in FIG. 1. Such a coder is described in considerable detail in the above-cited Jayant and Noll book in chapter 6 and will not be elaborated on here, except in one regard.

That is, because the filtering used in the system in FIG. 1 involves both spatial and temporal contributions, it proves convenient to have the predictor used in the otherwise standard DPCM coder be switchable to be either purely spatial predictor or a spatial-temporal predictor. More particularly, the predictive coding strategy is a three-dimensional switched predictor where for each sub-band we predict the current data point $x_{i,j,t}$ by $$\hat{x}_{i,j,t} = \begin{cases} a_1\hat{x}_{i,j-1,t} + a_2\hat{x}_{i-1,j,t} + a_3\hat{x}_{i,j,t-1} & e_n \leq T_1 \\ b_1\hat{x}_{i,j-1,t} + b_2\hat{x}_{i-1,j,t} + b_3\hat{x}_{i-1,j-1,t}e_n > T_1 \end{cases} \quad (1)$$

where $$e_n = \frac{1}{n*n} \sum_{i=1}^{n} \sum_{j=1}^{n} e_{i,j,t}^2 \quad (2)$$

and $$e_{i,j,t} = x_{i,j,t} - \hat{x}_{i,j,t}. \quad (3)$$

As before, term $x_{i,j,t}$ represents the intensity of a scene at the ith line, jth column and the tth frame and $\hat{x}_{i,j,t}$ is the predicted intensity of $x_{i,j,t}$. The optimum predictor coefficients $a=\{a_1,a_2,a_3\}$ for the spatial-temporal predictor and $b=\{b_1,b_2,b3\}$ for the spatial predictor are computed for each sub-band at every frame in time in standard fashion, as taught in the prior art.

The empirically derived threshold value $T_1$ determines whether the prediction is spatial-temporal or purely spatial. For sub-band pixel intensities in the range ($-128,128$,) a good value for $T_1$ has been found to be 10.

The error signal is coded using a Max quantizer based on a Laplacian pdf described, e.g., in the above-cited Jayant and Noll book.

For typical image sequences and bit rates described, it often occurs that less than all sub-bands need be encoded. For example, only bands 1–4 and band 8 need be coded in many cases. The rest of the sub-bands have very little signal energy and can be discarded. Sub-band 8, corresponding to the low spatial-high temporal frequency band acts as a motion detector in that when an object moves in the original image sequence, the edges of the object appear in this sub-band. By carefully coding this sub-band along with the low spatial—low temporal frequency bands 1-4, good coding results are obtained.

Figures 4, 5:
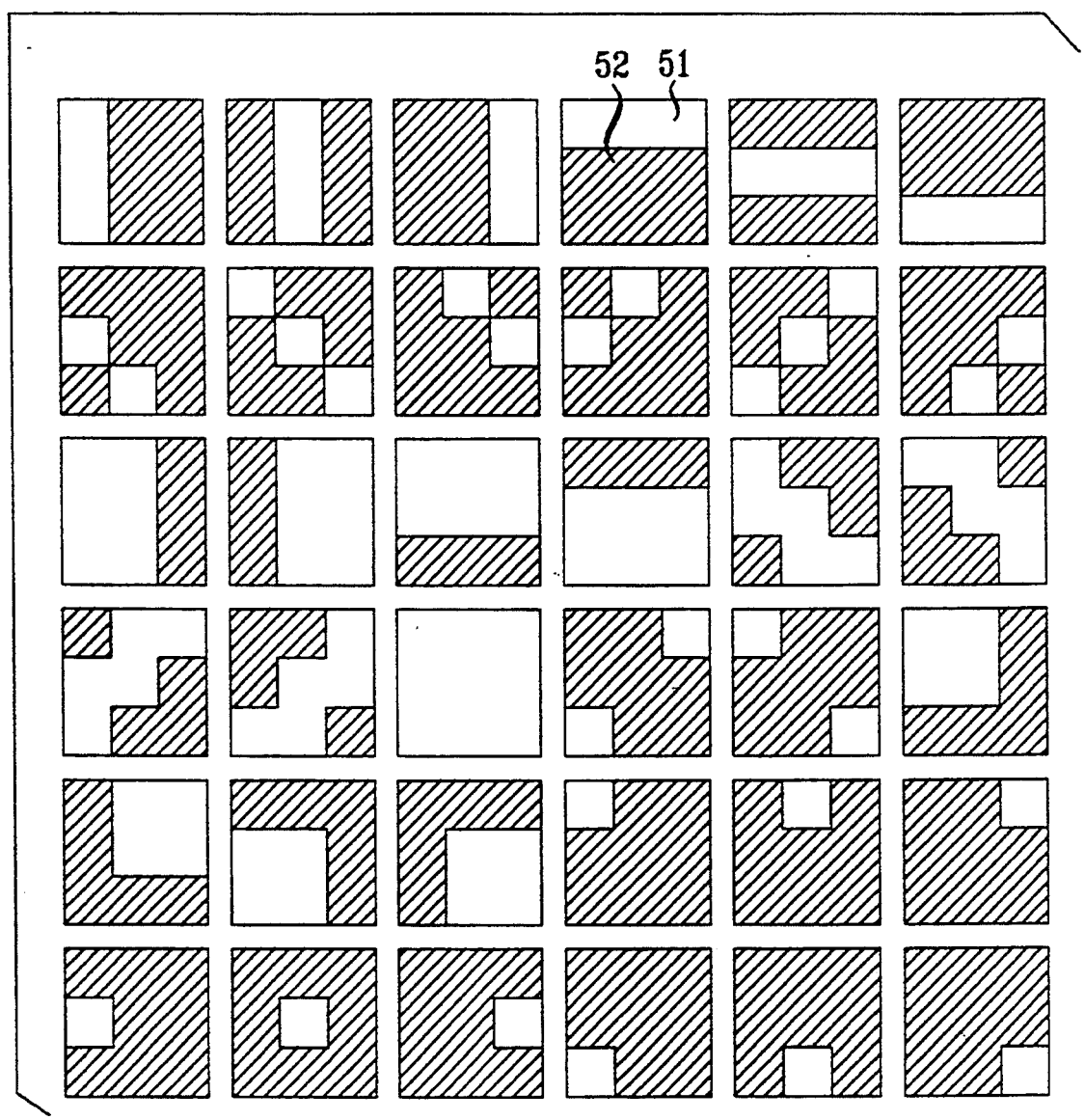
FIG. 4 shows a convenient labeling of the sub-bands for the filter of FIG. 2.
FIG. 5 is a typical code book of geometric vectors used in coding information including the sub-band signals used in the system of FIGS. 1–3.

FIG. 4 shows a convenient organization of the outputs of the 11-band frequency decomposition accomplished by the filter in FIG. 3 for a typical image sequence under consideration. When appropriately scaled, the data in the respective sub-bands can be viewed using standard video systems. The right half of FIG. 3, bands 1-7, corresponds to the low temporal frequency band whereas the left half of the figure, bands 8-11, corresponds to the high temporal frequency band. Within each temporal band, the lowest right corner corresponds to the lowest spatial frequency band labeled as sub-band 1 and sub-band 8 while the upper left corner corresponds to the highest spatial frequency band labeled as sub-band 7 and sub-band 11. The data in each band can be conveniently rescaled for display purposes to be compared to the energy levels in the various sub-bands. Sub-band 1, will usually be seen to have a high energy level compared to other sub-bands; this verifies that many of the high frequency sub-bands do not need to be coded. Sub-band 8 acting as a motion detector shows the edges of the images which are moving in the original image sequence.

The data in bands 2–11 is highly structured and each spatial-temporal frequency location has a characteristic structure associated with its frequency content. For example, sub-band 2 corresponding to high vertical— low horizontal spatial frequency components consists of mostly horizontal strips while sub-band 3 corresponding to low vertical—high horizontal spatial frequency components consists of mostly vertical strips. The data in sub-band 1 indicates where the edges are located; thus indicating where the data should appear in the higher frequency bands.

Vector Quantization

The remainder of the system of FIG. 1 relates to the vector quantization of information signals, illustratively the video image signals 100-$i$ that have been filtered and have been found to be in sub-bands having sufficient energy to warrant further coding.

The vector quantization in accordance with the present invention, in common with other such techniques, employs a codebook 160 shown in FIG. 1 and, more particularly, in FIG. 5. The codebook vectors in the illustrative codebook of FIG. 5 are 36 in number and represent for the present video processing application, two-dimensional patterns to be matched with corresponding areas of the image sub-band patterns.

While the particular code vectors illustrated in FIG. 5 prove useful in the present illustrative application, it should be understood that other applications may profit from the use of linear array patterns of varying length, or by any arbitrary patterns suitable to the application. Thus if speech information signals are to be processed, it might prove convenient to use a variety of linear patterns for the vectors, while an application relating to facsimile signals may profit from the use of patterns relating to two-dimensional arrays perhaps including alpha-numeric character patterns.

While the codebook vectors shown in FIG. 5 are shown as elements in a 3×3 array, no such limitation is fundamental to the present invention. That is, even for two-dimensional arrays, 4×4 or other size arrays may prove advantageous in particular cases (see below). Likewise, though the codebook shown has 36 vectors, conveniently indexed as 1 through 6 for the first row through 31 through 36 for the last row, the number of vectors used is not critical to the present invention. Particular numbers of vectors will be selected as the application may dictate. When the structure of the input multi-level (e.g., video) signals is highly structured, the vectors may be accordingly structured and, where appropriate, limited to a greater or larger number.

It is important to note, however, that the vectors can be selected without the need for prior training, or retraining while in use. That is, the vectors can be selected prior to use with any data, whether based on observed structure of the signals or otherwise. This should be contrasted with vector quantization techniques described, e.g., in Y. Linde, A. Buzo, and R. M. Gray, *An Algorithm For Vector Quantizer Design*, IEEE Transactions on Communications, COM-28, pp. 84–95, January 1980.

In operation, the surviving sub-band signals (after thresholding) appearing on inputs 160 to the geometrical vector quantizer 150 in FIG. 1 are compared systematically with the vectors stored in codebook 160. Multi-level signals from each sub-band (representing video amplitudes in the application under consideration) are presented one sub-band at a time.

Part of the processing of input multi-level signals and stored vectors in accordance with the present invention includes assigning magnitudes to the two-valued areas of the vectors of FIG. 5. For illustrative purposes, the code vectors of FIG. 5 are shown as having elements of two magnitudes, one associated with the non-cross-hatched areas such as 51 in typical vector with index 4 in FIG. 5, and another with the cross-hatched areas indicated as 52 in that vector. (It should be noted that the area 51, for the vector with index number 4, corresponds to three vertically arranged pixels in the current application, while the area 52 corresponds to the two vertical rows of pixels, with each such row having three pixels).

The magnitudes assigned to these elements (pixels, here) is based on the magnitudes for the pixels in a corresponding current 3×3 area in the image for a particular sub-band. More particularly, the magnitudes for the area 51 and 52 in a particular vector, e.g., that with index 4, are formed by computing $$M_1 = \frac{1}{3} \sum_{i=1}^{1} \sum_{j=1}^{3} x_{i,j}$$

$$M_2 = \frac{1}{6} \sum_{i=2}^{3} \sum_{j=1}^{3} x_{i,j}$$

for each set of 3×3 input multilevel signals which together cover the entire frame for one sub-band. The exact ranges for the summations are, of course, dictated by the structure of the particular vector. The ranges for $M_1$ are conveniently associated with area 51 (unshaded area) in the vectors of FIG. 5, and $M_2$ is associated with the shaded areas 52 of the vectors of FIG. 5. It will be noted that $M_1$ and $M_2$ are the average intensities of the multi-level signals (pixels) in the respective areas 51 and 52 corresponding to vector 4. This will be time for other vectors having different particular areas 51 and 52. It should be noted, however, that this averaging merely provides a magnitude representative of the pixel intensities associated with the area corresponding to the code book vector areas. Other particular representative values, e.g., maximum values for an area, can be used in appropriate cases.

It proves convenient to refer to the input 3×3 set as an array $b_1$ and the current vector, with the magnitude calculated above the respective elements as $\hat{b}_1$.

The comparison for a particular 3×3 area in the input is, of course, compared with all of the vectors in the codebook and a corresponding set of $b_1$ arrays computed for each. An error metric, conveniently the mean square error metric $$e = \frac{1}{9} \sum_{i=1}^{3} \sum_{j=1}^{3} (b_1 - \hat{b}_1)^2 \quad (4)$$

is computed for each $b_1$ and $\hat{b}_1$, and the vector corresponding to the smallest error is selected as the best match. The subtraction in Eq. 4 is, of course, a matrix subtraction with the indicated i and j values identifying the rows and columns, respectively.

As noted, this comparison is performed, for the present illustrative application, for all 3×3 arrays in each of the relevant higher-order sub-bands, i.e., 2, 3, 4 and 8 for the example mentioned above.

For each vector selected as being the best match, the vector index (after Huffman coding as described below) is conveniently sent, along with the magnitudes $M_1$ and $M_2$ to a multiplexer 190 in FIG. 1, where this information is combined with the DPCM information from DPCM coder 170.

To further reduce the amount of information required to code an input set of multi-level signals, such as the video information currently under discussion, it proves convenient to further process the index and magnitude information prior to the multiplexing operation. This reduction is possible because it often occurs that a null vector having only a single magnitude may occur with considerable frequency. Thus in video information, the background in some spatial sub-bands, and much motion content (i.e., temporal components) will not contribute significant information much of the time. In such cases, a "null vector", such as the vector having index 21 in FIG. 5 will be selected with high frequency.

Moreover, the magnitudes $M_1$ and $M_2$ may differ little in many occurrences. Thus it proves convenient to send the same null vector when the magnitudes vary by less than some preselected threshold. More particularly, if $|M_1-M_2|>$ a threshold, then the vector selected by the normal comparison is sent, while if $|M_1-M_2| \leq$ this threshold, only the null character is sent along with one of the magnitudes which differs by less than the threshold value. (It may prove convenient to select magnitude equal to the average, or some other representative value, of the two nearly equal magnitudes in such cases.)

For the above indicated magnitude variations for the input multi-level signals, it proves convenient to select a threshold value of 5, though other particular values may be chosen to fit bit rate and amplitude variation constraints.

Since the null vector will occur with relatively great frequency, it is of great advantage to code its index with a small number of bits. For this purpose the well-known Huffman coding techniques prove useful. This operation is shown in FIG. 1 by the block 180. The details of implementation of Huffman coding are described extensively in the art, e.g., the Jayant and Noll book, supra. Other particular non-uniform code length techniques, also well-known in the art can be used in particular cases.

FIG. 2 shows a decoder counterpart to the coder of FIG. 1. Coded signals received from the channel 195 are first demultiplexed in unit 200 in reciprocal fashion to multiplexer 190 in FIG. 1 to separate the DPCM-encoded sub-band 1 information and the vector quantized information for the higher sub-bands. Huffman decoder 210, well-known in the art, performs the decoding of the vector indexes and provides these indexes and corresponding magnitude information to the vector quantizer decoder 230. This latter unit operates in standard fashion to identify the vectors to be selected from codebook 220 for application to the sub-band synthesis unit 250 of the form known in the art to reverse the operation of filter 110 of FIG. 1. The output of the synthesis unit 250 is the reconstructed frame information initially supplied to the circuit of FIG. 1.

While the above description has proceeded in terms of a multi-level gray scale input signal, it should be apparent that a suitable combination of color component signals can either be processed individually as described above, or can be even more efficiently processed by using color component combining techniques well-known in the art prior to applying the teachings of the present invention.

Fast Codebook Search

As described above, a codebook vector is illustratively selected for coding by (i) comparing a particular 3×3 input block to vectors of a geometric codebook, (ii) determining an error metric for each comparison, and (iii) selecting the geometric codebook vector having the smallest error metric (see expressions for $M_1$ and $M_2$, equation (4), and associated text, above). This technique for finding the best vector in the codebook involves a comparison of the $3 \times 3$ input block to each vector of the codebook. For small codebooks, such as that presented in FIG. 5, this exhaustive codebook search is practical. However, for larger codebooks, or when codebook search speed is critical, a faster search technique may be desirable.

The present invention provides a fast codebook search technique which determines the best matching geometric codebook vector for a given input block. This fast search technique allows the selection of the same best matching codebook vector as would be selected by the exhaustive technique described above, but with many fewer computations. For example, assuming a $3 \times 3$ input block and a codebook of 256 unique vectors, the fast search technique of the present invention can determine the best matching code vector with only 9 codebook vector comparisons, rather than 256, as would be required by the exhaustive search technique.

The first step in the fast codebook search technique calls for an identification of the intensity values of pixels in an input block, and a determination of a pixel order based on intensity. Illustratively, the pixels may be ordered according to increasing pixel intensity (or gray level) (i.e., beginning with the pixel of the block having an intensity level closest to white, and ending with the pixel having an intensity closest to black).

Figure 6:
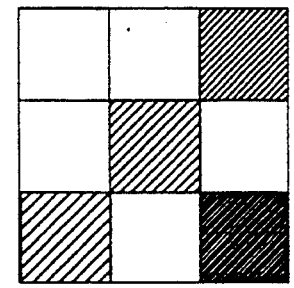
FIGS. 6a–c present the order of pixels in a block, the magnitudes of pixels in a block, and an illustrative input block to be coded, respectively.

For example, as presented in FIG. 6a, each pixel in an input block to be coded may be represented according to its location in the block, 1-9. As shown in FIG. 6b, each of the pixels 1-9 of such a block has an associated intensity, x where n is an index specifying a pixel location in the block (i.e., $x_n$, $1 \leq n \leq 9$). In the illustrative input block of FIG. 6c, the pixels have the following order based on increasing pixel intensity:

$$x_1, x_2, x_4, x_6, x_8, x_7, x_5, x_3, x_9,$$

where pixels 1, 2, 4, 6, and 8 are white (i.e., $x_1 = x_2 = x_4 = x_6 = x_8 = 0$), and pixels 7, 5, 3, and 9 have increasingly darker gray-levels, respectively (i.e., $0 < x_7 < x_5 < x_3 < x_9$).

Next, a series of logical partition structures is defined. A logical partition structure separates the pixels into groups of one or more pixels reflecting pixel intensity order. Each partition structure represents a possible geometric codebook vector to be considered according to the fast search technique of the present invention. From among these possible codebook vectors is chosen the vector which best represents the input block according to an error metric.

Illustratively, each partition structure defines two groups of pixels: a lighter pixel group having group intensity $M_1$, and a darker pixel group having group intensity $M_2$. A group intensity may be determined as the average of the intensities of pixels in the group.

For the illustrative input block presented in FIG. 6c having the pixel intensity order discussed above, a first partition structure may be defined by logically separating pixel intensity $x_1$ from the balance of the ordered pixel intensities described above. To wit:

$$x_1, \mid x_2, x_4, x_6, x_8, x_7, x_5, x_3, x_9,$$

Figure 7:
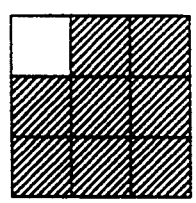
FIGS. 7a–i present illustrative partition structures for the input block presented in FIG. 6c.
Figure 7:
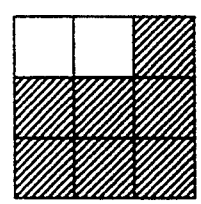
Figure 7:
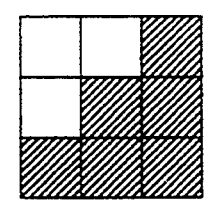
Figure 7:
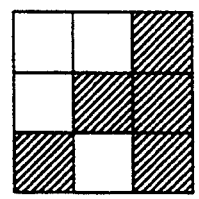
Figure 7:
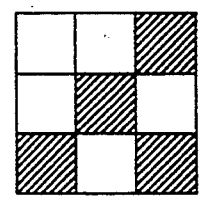
Figure 7:
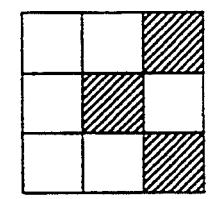
Figure 7:
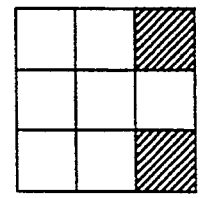
Figure 7:
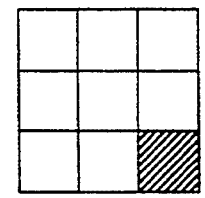
Figure 7:
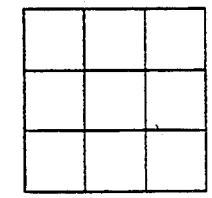

(see FIG. 7a). In this case, pixel 1 (having intensity $x_1$) serves as the lighter group (with $M_1 = x_1$), while the balance of the pixels (associated with the balance of the intensities of the partition structure) serves as the darker group (with $M_2 = \frac{1}{8}(x_2 + x_4 + x_6 + x_8 + x_7 + x_5 + x_3 + x_9)$. The error metric of equation (4) is applied to the first partition structure providing a distance score between the partition structure and the input block.

The next partition structure is determined by incorporating into the lighter group the next darker pixel as determined by the order of pixel intensities described above. To wit:

$$x_1, x_2 \mid x_4, x_6, x_8, x_7, x_5, x_3, x_9,$$

(see FIG. 7b). The group intensities and a distance score for this partition structure are determined as described above.

This technique is repeated defining other possible partition structures of the pixel intensity order shown in FIGS. 7c–i. The partition presented in FIG. 7i represents the null vector discussed above. FIG. 7e presents the partition structure which most closely matches the input block presented in FIG. 6c. This structure is selected by the fast technique as the codebook vector (with associated intensities) which most closely represents the input block. Note that partition structure of FIG. 7e is such that the pixels of the lighter intensity group correspond to the white pixels of the input block, while the pixels of the darker intensity group correspond to the pixels of varying gray levels of the input block. The vector of FIG. 7e is the same as that which would be selected by the exhaustive codebook search technique. It has, however, been determined with far fewer codebook comparisons. With the correct codebook vector identified, its index is determined by, e.g., a table look-up.

Though only two magnitudes have been described in connection with the illustrative codebook of FIG. 5, it is clear that the teachings of the present invention can be readily applied to codebooks with more than two magnitudes for the elements of the vectors.

Three Magnitude Geometric Vector Quantization

A technique involving, illustratively, three magnitudes and $4 \times 4$ ternary patterns can provide a similar bit rate to the scheme with two magnitudes and $3 \times 3$ blocks described above. It may be implemented by repeated application of the 2-magnitude technique with the fast search procedure described above. An illustrative three-magnitude vector quantization technique is described below.

FIG. 8a presents 16 pixels constituting an original $4 \times 4$ input block. These pixels may be ordered, as discussed above, according to increasing value, from most negative to most positive value, $$x_3, x_6, x_9, x_5, x_{22}, x_{13}, x_1, x_7, x_{10}, x_{12}, x_{15}, x_{16}, x_4, x_8, x_{14}.$$

Through the repeated use of the fast search two-magnitude technique, with one magnitude constrained to be, e.g., zero, a best match (in a mean-square error sense) may be found to be of the form:

$$\underbrace{M^-, \ldots, M^-}_{R^-}, \underbrace{0, \ldots, 0}_{R^0}, \underbrace{M^+, \ldots, M^+}_{R^+},$$

when the original block includes both negative and positive pixel values. The quantities M⁻ and M⁺ represent the magnitudes associated with positive and negative pixel groups, R⁺ and R⁻, respectively. R⁰ represents the group of pixels assigned the constrained value, zero.

The fast search two-magnitude technique may be used twice to determine R⁻, M⁻ and R⁺, M⁺. The first use of the fast-search two-magnitude technique determines R⁻ and M⁻ based on the non-positive-valued pixels of the input block. All positive-valued pixels of the input block are ignored for this purpose (i.e., the input block is treated as though it comprised only the non-positive-valued pixels). As discussed above, the fast-search two-magnitude technique is an iterative procedure which determines R⁻, M⁻ by considering the groups of pixels and associated magnitudes which yield the minimum error metric.

In the first iteration, the least negative pixel of the set of non-positive pixels is set to zero. The fast search, two-magnitude technique is then performed on these pixels yielding an error metric. Each additional iteration is obtained by setting an additional next least negative pixel to zero and performing the fast search, two-magnitude technique to yield an error metric. The iteration which yields the minimum error metric provides the optimal partitioning for the non-positive pixels.

The second use of the fast search, two-magnitude technique is similar to the first, but uses non-negative-valued pixels to determine R⁺, M⁺.

FIG. 8b presents the results of the two applications of the fast search, two-magnitude technique on the input block of FIG. 8a. The results show that pixels 3, 6, and 9 of the input block form the negative pixel group, R⁻, having an average magnitude of M⁻ = −38. Pixels 8 and 14 form the positive pixel group R⁺, having an average magnitude of M⁺ = 22.

Figures 8, 9:
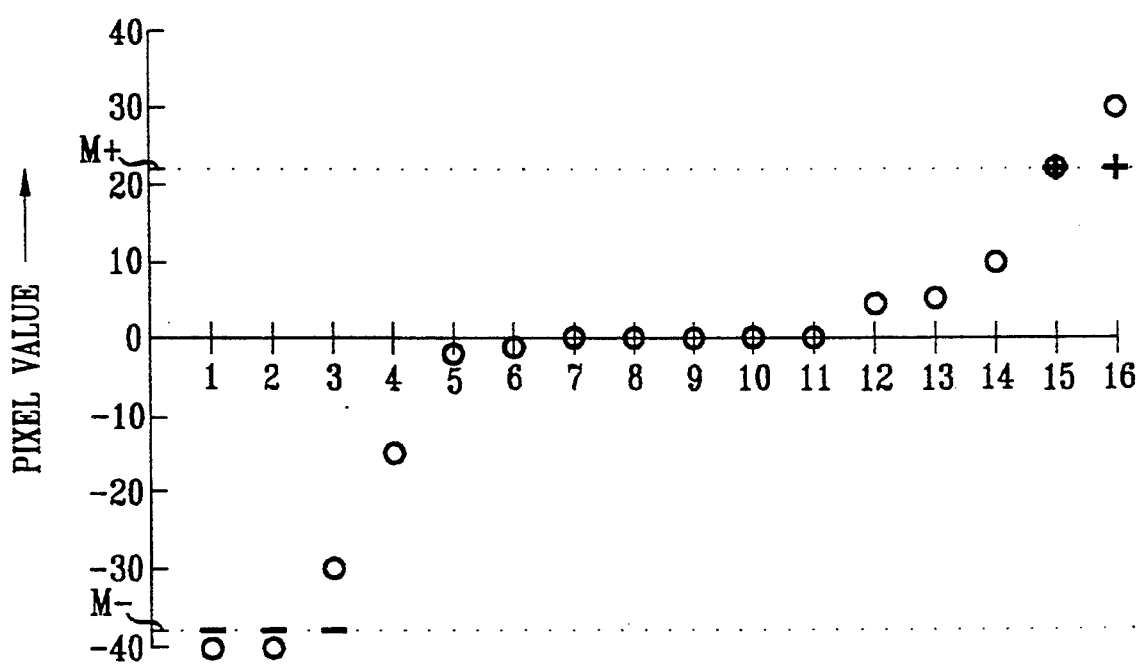
FIG. 9 presents the magnitudes of the original input block presented in FIG. 8a in increasing order.

FIG. 9 presents the magnitudes of the original input block pixels in increasing order. The two R⁺ pixels are denoted with a "+" sign, while the three R⁻ pixels are denoted with a "−" sign. All other original pixels are grouped by the technique as the eleven R⁰ pixels having magnitude zero.

If the original block includes only non-positive pixel values, a best match may be found to be of the form:

$$\underbrace{M^{--}, \ldots, M^{--}}_{R^{--}}, \underbrace{M^{-}, \ldots, M^{-}}_{R^{-}}, \underbrace{0, \ldots, 0}_{R^{0}}.$$

In this case, one pixel group of the coded vector is constrained to be zero, and pixel groups R⁻⁻ and R⁻ (and their respective magnitudes M⁻⁻ and M⁻) need to be determined. Again the fast search, two-magnitude technique may be used. The pixels are ordered in terms of increasing magnitude. The fast search, two-magnitude technique is begun by constraining the most positive pixel of the input block to be the value of zero. The above-described iterative partitioning technique is performed on the balance of the input block, and the partition yielding minimum error is noted. Next, the two most positive pixels of the input block are constrained to be zero, and the iterative fast-search technique is again performed on the balance of the block yielding a partition with minimum error. This process is repeated, each time constraining an additional pixel to be zero prior to determining a partition responsible for minimum error. At the conclusion of the iterations, the errors associated with the identified partitions are compared to determine the partition having the minimum error across partitions. This minimum error partition is associated with a given collection of pixels constrained to be zero, R⁰, and a given R⁻⁻ and R⁻ (with respective magnitudes M⁻⁻ and M⁻). This partition and magnitudes is the "best match" codebook vector representing the input block.

If the original block includes only non-negative pixel values, a best match may be found to be of the form:

$$\underbrace{0, \ldots, 0}_{R^{0}}, \underbrace{M^{+}, \ldots, M^{+}}_{R^{+}}, \underbrace{M^{++}, \ldots, M^{++}}_{R^{++}}.$$

This case is the same as the one discussed immediately above but requires solving for R⁺, M⁺ and R⁺⁺, M⁺⁺, rather than their negative counterparts.

We claim:

1. A method of coding a set of multi-level signals comprising the steps of:
    ordering the multi-level signals according to values of a signal parameter;
    one or more times, partitioning the order of multi-level signals into two or more elements, each element including one or more multi-level signals;
    determining a magnitude for an element based upon signal parameter values for signals in the element;
    comparing a partition of elements with the set of multi-level signals to determine a difference metric based on partition element magnitudes and multi-level signal parameter values; and
    selecting as a vector representing the set of multi-level signals a partition of elements which satisfies a difference metric criterion.

2. The method of claim 1 wherein the signal parameter comprises signal intensity.

3. The method of claim 1 wherein the magnitude of a partition element is determined based on an average signal parameter value for one or more multi-level signals of the element.

4. The method of claim 3 wherein the signal parameter value comprises signal intensity value.

5. The method of claim 1 wherein the step of determining a magnitude comprises the step of determining a magnitude for each element of a partition.

6. The method of claim 1 wherein the difference metric comprises a mean square difference.

7. The method of claim 1 wherein the difference metric criterion comprises a minimum difference metric.

8. The method of claim 1 wherein the step of selecting comprises determining a codebook index to represent the selected vector.

9. The method of claim 8 further comprising the step of communicating the determined codebook index to a receiver.

10. The method of claim 1 wherein the set of multi-level signals comprises a set of image pixels.

11. The method of claim 10 wherein a signal level reflects a gray level of a pixel.

12. A method of coding a set of multi-level signals comprising the steps of:
    providing a set of vectors, each of said vectors comprising a geometric array of elements, wherein one or more first elements of each vector have associated therewith predetermined magnitudes, and wherein one or more other elements of each vector have associated therewith magnitudes determined based on levels of multi-level signals being coded;

comparing multi-level signals with one or more of the vectors to determine, for each such vector, a difference metric based on multi-level signal levels and vector element magnitudes; and representing the set of multi-level signals with use of a vector which satisfies a difference metric criterion.

13. The method of claim 12 wherein the first difference metric criterion comprises a minimum difference metric.

14. The method of claim 12 wherein the step of representing the set of multi-level signals comprises the step of determining a codebook index to represent the vector which satisfies the first difference metric criterion and further comprising the step of communicating the determined codebook index to a receiver.

15. The method of claim 12 wherein the step of providing a set of vectors comprises the step of selecting one or more first elements of a vector to have predetermined magnitudes, the selection of the first elements based on the multi-level signals.

16. A method of coding a set of multi-level signals, wherein the set of multi-level signals comprises at least one signal having a positive level and at least one signal having a negative level, the method comprising the steps of:
   a. ordering multi-level signals of the set according to signal level;
   b. a plurality of times, partitioning the ordered, non-positive multi-level signals into at least two groups of non-positive signals;
   c. for a partition of ordered, non-positive multi-level signals,
      1. forming a first vector of signals, the first vector including first and second sets of signals,
         i. the signals of the first vector's first set having predetermined magnitudes and corresponding to a first group of non-positive multi-level signals in the partition, and
         ii. the signals of the first vector's second set having magnitudes based on levels of signals in a second group of non-positive multi-level signals in the partition;
      2. comparing the first vector of signals with ordered, non-positive multi-level signals to determine a first difference metric;
   d. identifying a first vector of signals having a first difference metric which satisfies a first difference metric criterion;
   e. a plurality of times, partitioning the ordered, non-negative multi-level signals into at least two groups of non-negative signals;
   f. for a partition of ordered, non-negative multi-level signals,
      1. forming a second vector of signals, the second vector including first and second sets of signals,
         i. the signals of the second vector's first set having predetermined magnitudes and corresponding to a first group of non-negative multi-level signals in the partition, and
         ii. the signals of the second vector's second set having magnitudes based on levels of signals in a second group of non-negative multi-level signals in the partition;
      2. comparing the second vector of signals with ordered, non-negative multi-level signals to determine a second difference metric;
   g. identifying a second vector of signals having a difference metric which satisfies a second difference metric criterion; and
   h. combining the identified first and second vectors of non-positive and non-negative signals to determine a vector of signals for use in coding the set of multi-level signals.

17. The method of claim 16 wherein each of the first and second difference metric criteria comprises a minimum difference metric.

18. A method of coding a set of multi-level signals, wherein the set of multi-level signals includes non-positive signal levels only, the method comprising the steps of:
   a. ordering multi-level signals of the set according to signal level;
   b. a plurality of times, forming a vector of signals by
      2. partitioning the ordered, multi-level signals into first and second groups of signals, the first group of signals comprising at least one of the least negative multi-level signals and the second group comprising one or more of the balance of the multi-level signals,
      2. assigning a predetermined magnitude to one or more first signals of the vector, which first signals correspond to the signals of the first group of signals,
      3. a plurality of times, partitioning the second group of multi-level signals into first and second sub-groups of multi-level signals,
      4. for a partition of the second group of multi-level signals
         i. assigning a magnitude to one or more second signals of the vector based on the multi-level signals of the first sub-group of multi-level signals,
         ii. assigning a magnitude to one or more third signals of the vector based on the multi-level signals of the second sub-group of multi-level signals,
         iii. comparing the second and third signals of the vector with ordered, non-positive multi-level signals to determine a first difference metric;
      5. identifying second and third signals of the vector having a .first difference metric which satisfies a first difference metric criterion; and
      6. comparing the vector of signals with ordered, multi-level signals to determine a second difference metric based on vector signal magnitudes and multi-level signal levels; and
   c. identifying a vector of signals for use in coding the multi-level signals, the identified vector having a second difference metric which satisfies a second difference metric criterion.

19. The method of claim 18 wherein each of the first and second difference metric criteria comprises a minimum difference metric.

20. A method of coding a set of multi-level signals, wherein the set of multi-level signals includes non-negative signal levels only, the method comprising the steps of:
   a. ordering multi-level signals of the set according to signal level;
   b. a plurality of times, forming a vector of signals by
      1. partitioning the ordered, multi-level signals into first and second groups of signals, the first group of signals comprising at least one of the least positive multi-level signals and the second group comprising one or more of the balance of the multi-level signals, 2. assigning a predetermined magnitude to one or more first signals of the vector, which first signals correspond to the signals of the first group of signals, 3. a plurality of times, partitioning the second group of multi-level signals into first and second sub-groups of multi-level signals, 4. for a partition of the second group of multi-level signals,
   i. assigning a magnitude to one or more second signals of the vector based on the multi-level signals of the first sub-group of multi-level signals,
   ii. assigning a magnitude to one or more third signals of the vector based on the multi-level signals of the second sub-group of multi-level signals;
   iii. comparing the second and third signals of the vector with ordered, non-negative multi-level signals to determine a first difference metric;

5. identifying second and third signals of the vector having a first difference metric which satisfies a first difference metric criterion;

6. comparing the vector of signals with ordered, multi-level signals to determine a second difference metric based on vector signal magnitudes and multi-level signal levels; and c. identifying a vector of signals for use in coding the multi-level signals, the identified vector having a second difference metric which satisfies a second difference metric criterion.

21. The method of claim 20 wherein each of the first and second difference metric criteria comprises a minimum difference metric.

* * * * *